(12) United States Patent
Bydder et al.

(10) Patent No.: US 6,943,547 B2
(45) Date of Patent: Sep. 13, 2005

(54) MAGNETIC RESONANCE IMAGING USING GENERALIZED SMASH

(75) Inventors: Mark Bydder, London (GB); Joseph V. Hajnal, London (GB); David J. Larkman, London (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 58 days.

(21) Appl. No.: 10/126,331

(22) Filed: Apr. 19, 2002

(65) Prior Publication Data

US 2003/0030437 A1 Feb. 13, 2003

(30) Foreign Application Priority Data

Apr. 20, 2001 (GB) .............................. 0109790

(51) Int. Cl.[7] .................................. G01V 3/00
(52) U.S. Cl. ....................................... 324/307
(58) Field of Search ................ 324/300, 307, 324/309–312, 318, 322

(56) References Cited

U.S. PATENT DOCUMENTS

| | | | | |
|---|---|---|---|---|
| 4,684,891 A | * | 8/1987 | Feinberg ...................... | 324/309 |
| 5,910,728 A | * | 6/1999 | Sodickson ................... | 324/309 |
| 5,923,789 A | * | 7/1999 | Avinash ...................... | 382/276 |
| 6,215,307 B1 | * | 4/2001 | Sementchenko ............ | 324/318 |
| 6,289,232 B1 | * | 9/2001 | Jakob et al. ................. | 600/410 |
| 6,326,786 B1 | * | 12/2001 | Pruessmann et al. ....... | 324/312 |
| 6,366,092 B1 | * | 4/2002 | Ehnholm et al. ........... | 324/309 |
| 6,377,045 B1 | * | 4/2002 | Van Den Brink et al. .. | 324/307 |
| 6,380,741 B1 | * | 4/2002 | Hajnal et al. ............... | 324/318 |
| 6,384,601 B1 | * | 5/2002 | Wiesler et al. .............. | 324/309 |
| 6,396,269 B1 | * | 5/2002 | Hajnal et al. ............... | 324/307 |
| 6,476,606 B2 | * | 11/2002 | Lee ............................. | 324/309 |

FOREIGN PATENT DOCUMENTS

| | | |
|---|---|---|
| EP | 1 014 102 | 6/2000 |
| WO | WO 98/21600 | 5/1998 |
| WO | WO 99/54746 | 10/1999 |
| WO | WO 00/72034 | 11/2000 |

OTHER PUBLICATIONS

Search Report under Section 17(5) for Application GB 0109790.6 dated Nov. 21, 2001.
Sodickson; "Tailored SMASH Image Reconstructions for Robust In Vivo Parallel MR Imaging"; *Magnetic Resonance in Medicine* 44:243–251 (2000).
Yi Wang, "Description of Parallel Imaging in MRI Using Multiple Coils"; Magnetic Resonance in Medicine, vol. 44, No. 3, Nov. 2000, pp. 495–499.
Ray F. Lee, et al., "An Analytical SMASH Procedure (ASP) for Sensitivity–Encoded MRI"; Magnetic Resonance in Medicine, vol. 43, No. 5, May 2000, pp. 716–725.
Mark Bydder, et al., "Generalized SMASH Imaging"; Magnetic Resonance in Medicine, vol. 47, No. 1, pp. 160–170.
PCT International Search Report for PCT/US02/12579.

* cited by examiner

*Primary Examiner*—Louis Arana
*Assistant Examiner*—Dixomara Vargas
(74) *Attorney, Agent, or Firm*—Thomas M. Lundin (57) ABSTRACT

In magnetic resonance imaging apparatus k-space data received from r.f. excitation pulses applied at successive phase-encode gradients and read-out while other gradients are applied is collected for individual coils of an array of r.f. receive coils. A processor 22 uses the lines of data received by each r.f. receive coil at each phase-encode gradient together with reference spatial sensitivity profiles of each coil in a phase-encode direction represented in terms of spatial harmonics of a fundamental frequency one cycle of which corresponds with a desired field of view, to generate a set of phase-encode lines. These lines are converted to image space in Fourier Transform processor 25 to produce an image for display on monitor 26.

18 Claims, 5 Drawing Sheets

MAGNETIC RESONANCE IMAGING USING GENERALIZED SMASH

BACKGROUND

This invention relates to magnetic resonance (MR) imaging.

Figure 1:
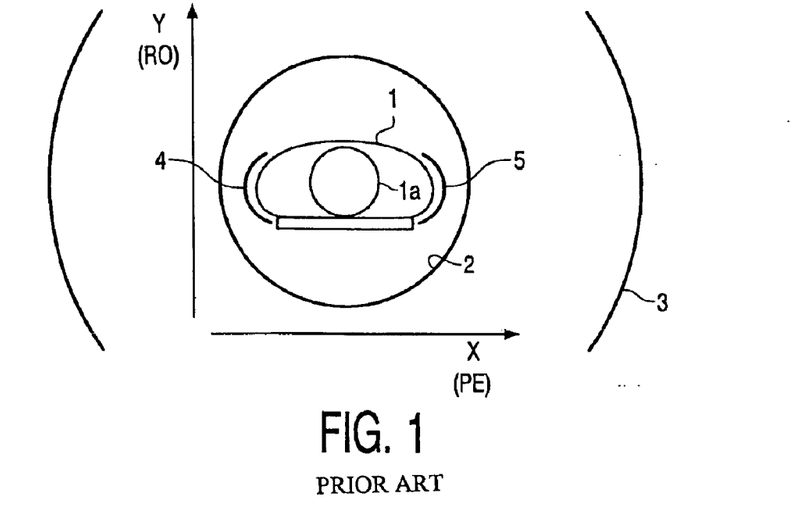
FIG. 1 is a schematic axial sectional view of known magnetic resonance imaging apparatus.

A prior art magnetic resonance imaging apparatus is shown in FIG. 1. A patient 1 (shown in section) is slid axially into the bore 2 of a superconducting magnet 3, and the main magnetic field is set up along the axis of the bore, termed by convention the Z-direction. Magnetic field gradients are set up, for example, in the Z-direction, to confine the excitation of magnetic resonant (MR) active nuclei (typically hydrogen protons in water and fat tissue) to a particular slice in the Z-direction e.g. that illustrated in FIG. 1 and, in the horizontal X and the vertical Y-directions as seen in FIG. 1, to encode the resonant MR nuclei in the plane of the slice. An r.f. transmit coil (not shown) applies an excitation pulse to excite the protons to resonance, and an r.f. receive coil array consisting of a pair of coils 4, 5 picks up relaxation signals emitted by the disturbed protons.

Figure 2:
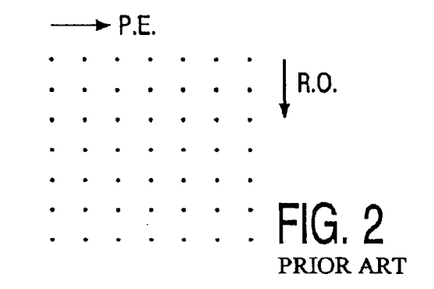
FIG. 2 is a representation of data in k-space resulting from the signal picked up by a receive coil of the apparatus.

To encode/decode received signals in the Y-direction, the signals are detected in the presence of a magnetic field gradient, termed a frequency encode or read-out (R.O.) gradient, to enable different positions of relaxing nuclei to correspond to different precession frequencies of those nuclei about the direction of the main magnetic field due to the influence of the gradient. The data is digitised, and so for each r.f. excitation pulse, a series of digital data points are collected, and these are mapped into a spatial frequency domain known as k-space (FIG. 2). Each r.f. pulse permits at least one column of digital data points to be collected.

To encode/decode the received signals in the X-direction, after each r.f. pulse has been transmitted and before data is collected with the read-out gradient applied, a magnetic field gradient in the X-direction is turned on and off. This is done for a series of magnitudes of magnetic field gradients in the X-direction, one r.f. pulse typically corresponding to a different magnitude of gradient in the X-direction. The series of measurements enable spatial frequencies to be built up in the X-direction.

On the k-space matrix shown in FIG. 2, the columns of data points correspond to data collected at different magnitudes of phase-encode (P.E.) gradients.

The field of view imaged by the magnetic resonance imaging apparatus depends on the spacing of the data points in the phase-encode and read-out directions, and the resolution of the image depends on how far the points extend in each direction i.e. how large the maximum phase-encode gradient is, and on the magnitude of the read-out gradient combined with the duration of data collection.

Conventionally, the data collected by the r.f. receive coil arrangement and depicted in FIG. 2 is subject to a two dimensional fast Fourier Transform in a Fourier Transform processor (not shown) to produce a pixelated spatial image.

Figure 3:
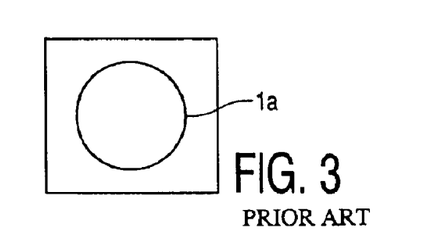
FIG. 3 is a representation of the shape in the image domain represented by the data in k-space.

A slice image is shown in FIG. 3. For the purposes of explanation, the symbol of a circle 1a, has been illustrated in both the patient 1 shown in FIG. 1 and the image shown in FIG. 3. FIG. 3 implies that the spacing of data points in the phase-encode gradient direction is sufficient to image the whole of the circle shown in FIG. 1. Between each r.f. pulse, there is a certain minimum pulse repetition time, and the collection of data implied by FIGS. 2 and 3 may therefore take an undesirably long time.

One technique used to reduce the data collection time is to cut out, say, half the phase-encode steps e.g. by keeping the same maximum phase-encode gradient but omitting every other column of data. This would then halve the data collection time.

The spacing of the data points in the phase-encode direction would now have doubled, so that the field of view in the corresponding image domain would have halved. (The field of view in the read-out direction would remain the same because the number of data points collected during read-out would remain the same.) The imaged area would now cover little more than half the width of the circle illustrated in FIG. 1. This is shown by the area 1b in FIG. 5. Unfortunately, aliasing causes the regions at the side of the circle to be folded back into the half-width area, the left hand region in FIG. 5 corresponding to the right hand region of the image, and vice versa.

To enable the data to be unfolded, the data is acquired using parallel imaging.

Parallel imaging makes use of spatial sensitivity differences between individual coils in an array to reduce the gradient encoding required during image acquisition. This reduces acquisition times by decreasing the number of phase-encoded lines of k-space that must be acquired. There are three distinct classes of practical implementation of parallel imaging, which are known as SENSE (Magnetic Resonance in Medicine 42: 952–962 (1999)—SENSE: Sensitivity Encoding for Fast MRI by Klaas P Pruessmann, Markus Weiger, Markus B Scheidegger and Peter Boesiger), SMASH (WO-A-98/21600 and Magnetic Resonance in Medicine 38: 591–603 (1997)—Simultaneous Acquisition of Spatial Harmonics (SMASH): Fast Imaging with Radiofrequency Coil Arrays by Daniel K Sodickson and Warren J Manning) and SPACE-RIP (WO-A-00/72050 and Magnetic Resonance in Medicine 44: 301–308 (2000)—Sensitivity Profiles from an Array of Coils for Encoding and Reconstruction in Parallel (SPACE RIP) by Walid E Kyriakos, Laurence P Panyah, Daniel F Kaches, Carl-Frederick Westin, Sumi M Bao, Robert V Mulkern and Ferenc A Jolesz): All of these methods require information about the coil sensitivity profiles (reference data), which is used to regenerate a full image data set from the sub-sampled k-space acquisition (target data).

Figure 4:
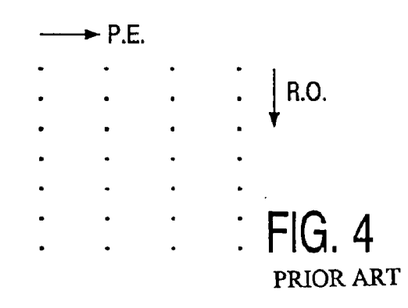
FIG. 4 is a representation of data in k-space with a reduced number of phase-encode gradients, picked up by a receive coil of the apparatus.
Figure 5:
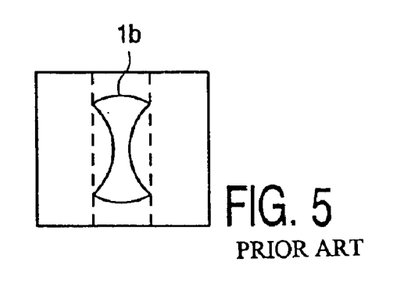
FIG. 5 is a representation of the aliased shape in the image domain represented by the data of FIG. 4.

SENSE operates in the image domain for both the target image data and the coil reference data. The method can be used with a wide range of coil geometries. A typical receive coil arrangement comprises coils 4 and 5 placed on opposite sides of the patient arranged in FIG. 1, in order that they have different fields of view. The target data is acquired for each receive coil with a reduced field of view, which results in aliasing, so that each coil produces a k-space representation as shown in FIG. 4, which can be Fourier Transformed into an aliased image as shown in FIG. 5. The two aliased images of FIG. 5 are then unfolded to the full field of view on a pixel by pixel basis using reference data, which records the relative responses of the receive coils 4 and 5. Reduced field of view imaging imposes a requirement of uniformly spaced samples in the phase-encode direction in k-space. Since processing concerned with unfolding is done in the image domain, individual pixels in the reduced field of view data get unfolded by integer numbers of final pixels (i.e. 1→1, 1→2, 1→3 etc). This requires solution of a set of linear simultaneous equations in which pixel intensities are weighted by the coil sensitivity at the final pixel locations. The numerical condition of these equations determines the local noise properties of the unfolded image, so that the signal-to-noise ratio (SNR) varies from pixel to pixel. The signal-to-noise ratio is better in the regions (e.g. in FIG. 5) where no aliasing occurs than where it does occur. The resulting patterns of noise variation generally reflect the coil geometry and can have a strong perceptual effect.

SPACE RIP uses k-space target data as input in conjunction with areal space representation of the coil sensitivities to directly compute a final image domain output, that is, the Fourier transform is embedded into the matrix involved. An unfolded image is directly produced from the reduced phase-encode gradient encoded collected data for the coils of the array (FIG. 4). Thus, it is a hybrid k-space/real space method and has a higher computational burden than either SENSE or SMASH. It does not require uniform sampling of k-space.

SMASH operates in k-space for the target image data but uses a real space representation of the coil sensitivity profiles. SMASH employs linear combinations of the coil reference data to explicitly construct spatial harmonics that are required to synthesis missing k-space lines. It does not suffer from spatially varying signal-to-noise ratio in the final images, since each point in k-space contributes to the whole image in the image domain.

Figure 6:
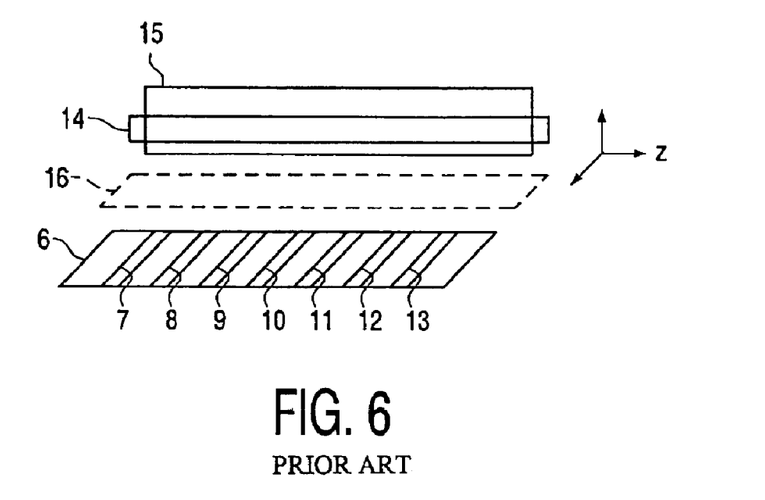
FIG. 6 is a perspective schematic view of an array of coils for use in SMASH type imaging.
Figure 7:
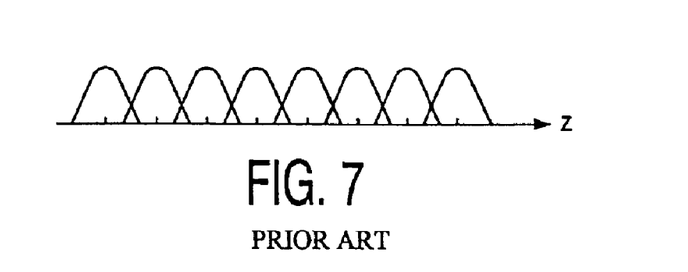
FIG. 7 is a graph showing the spatial sensitivity profiles of the coils of the array in FIG. 6.
Figure 8:
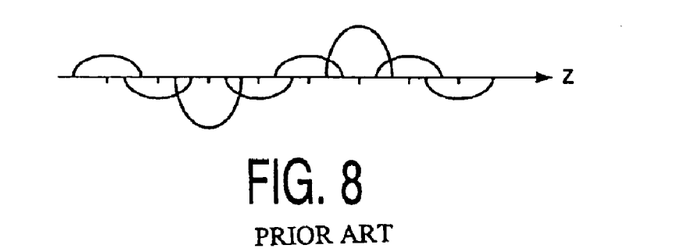
FIG. 8 is a graph showing the profiles of FIG. 7 weighted to produce a sine wave modulation.
Figure 9:
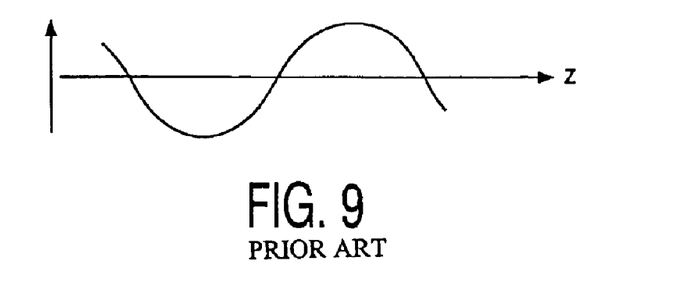
FIG. 9 is a graph showing the simplified sine wave produced by the weighting of FIG. 8.

A typical coil arrangement for SMASH is shown in FIG. 6. An array of coils 6 to 13 is arranged beneath the spine 14 of a patient 7 (shown schematically). Such a coil arrangement can be used to produce a saggital (vertical longitudinal) section through the spine (plane 15). The response patterns of the individual coils is shown in FIG. 7. If the outputs of the individual coils is suitably weighted and summed, it can be seen that, for example, the response of FIG. 8, and its simplified form of FIG. 9, can be produced. Such a weighted and summed signal modulates received r.f. signals along the length of the array in the same way as a phase-encoding gradient in the Z-direction modulates r.f. signals received by an equivalent received coil 16 (shown dotted). Accordingly, SMASH uses weighted combinations of the outputs of the individual coils of the array to simulate the effect of phase-encode gradients on the received r.f. signals. The fundamental is shown in FIGS. 8 and 9, but different weightings can be used to produce higher harmonics. Thus, signals representing several phase-encode gradient lines can be produced for the application of one phase-encode gradient.

However, SMASH is somewhat restrictive in the coil geometries it can accommodate. In particular, it is not well suited to use with very few coils and the requirement to generate specific spatial harmonics necessitates a given relationship between the imaging field of view and the coil structure.

Consider for example an arrangement with only two receive coils, an anterior coil 17 and a posterior coil 18 arranged above and below a patient (not shown) in the bore 19 of a magnetic resonance imaging apparatus. The spine of the patient is shown schematically by the reference numeral 14. The response of the two coils in the phase-encode direction is shown in FIG.

Combinations of the coil outputs 17, 18 cannot be used to generate missing k-space lines because the two coils do not in themselves enable a sinusoidal variation of the phase-encode gradient to be imitated in the phase-encode direction.

SUMMARY

The invention provides apparatus for magnetic resonance imaging, comprising means for exciting magnetic resonant (MR) active nuclei in a region of interest, an array of at least two r.f. receive coils for receiving data from the region of interest, means for creating magnetic field gradients in a phase-encode direction for spatially encoding the excited MR active nuclei, and processing means for using the lines of data received by each r.f. receive coil at each phase-encode gradient together with reference spatial sensitivity profiles of each coil in a phase-encode direction represented in terms of spatial harmonics of a fundamental frequency one cycle of which corresponds with a desired field of view, to generate a set of phase-encode lines.

The representation of the coil reference sensitivity profiles in terms of the Fourier domain (i.e. the K-space, spatial frequency domain), rather than in the domain of real space (i.e. image space) provides the advantages of improved freedom of choice of coil geometry compared to SMASH and improved computational efficiency compared to SPACE-RIP. Unevenly spaced coils, or just a pair of coils may be used.

The magnetic resonance imaging apparatus according to the invention permits phase-encode lines measured with one grid spacing to be transformed to a different grid spacing, and a set acquired at uneven phase-encode spacing to be converted, for ease of processing, to a set with even phase-encode spacing. Since an array coil is used, the invention is especially suited to parallel imaging, and missing lines of data may be generated.

DRAWINGS

Magnetic resonance imaging apparatus and a method of magnetic resonance imaging will now be described in detail, by way of example, with reference to the accompanying drawings, in which.

DESCRIPTION

Figure 10:
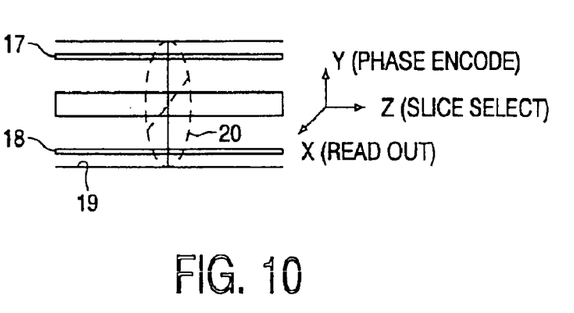
FIG. 10 is a schematic representation of an array of two coils in a magnetic resonance imaging apparatus according to the invention.

Referring to FIG. 10, one form of magnetic resonance imaging apparatus in accordance with the invention has a magnet of the kind described with reference to FIG. 1 having a bore 19 into which a patient can be slid. The cylinder 14 schematically represents a spine of the patient. The magnet can be resistive or superconducting, and the invention is also applicable to open magnets of any kind.

The apparatus includes r.f. excitation means (not shown) for exciting resonance in MR active nuclei such as protons. The apparatus also includes, like the apparatus of FIG. 1, means for creating magnetic field gradients in three orthogonal directions: in the Z-direction for selecting a slice such as 20 in which resonance is excited; in the X-direction to create spatial encoding using a frequency encode or read-out gradient; and in the Y-direction to create spatial encoding using a phase-encode gradient. However, any slice orientation could be selected if desired.

The r.f. signals from the excited region comprises an array of two r.f. receive coils, an anterior coil 17 and a posterior coil 18. These are planar coils arranged respectively above and below the patient.

Figure 11:
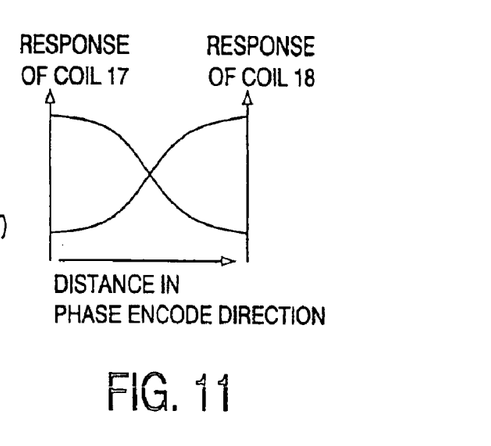
FIG. 11 is a graph showing the spatial sensitivity profile of each of the two coils of the apparatus of FIG. 10.

The reference spatial sensitivity profile of each coil in the phase-encode direction is shown in FIG. 11, the phase-encode direction in FIG. 11 being shown as extending from right to left. The left hand axis denotes the position of coil 17, while the right hand axis denotes the position of coil 18. A family of such profiles represents the profiles in the phase-encode direction for a series of positions in the frequency encode direction across the width of the slice 20.

Figure 16:
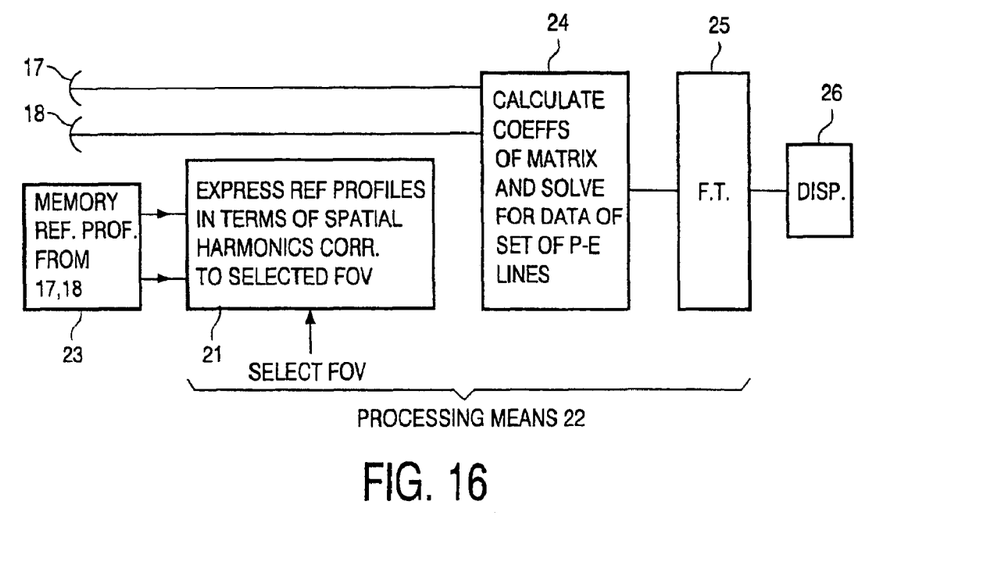
FIG. 16 is a diagram showing the architecture of the processing means of magnetic resonance imaging apparatus in accordance with the invention.

The maximum possible field of view is the distance between the coils. This field of view, or a lesser one if desired, is now selected using module 21 of processing means 22 (FIG. 16). Module 21 receives as input reference spatial profiles from memory 23 of the array coils 17, 18. The reference profiles may be measured with the array coils by imaging the subject or a phantom placed in the magnet bore, or the reference profiles may be calculated.

Figure 12:
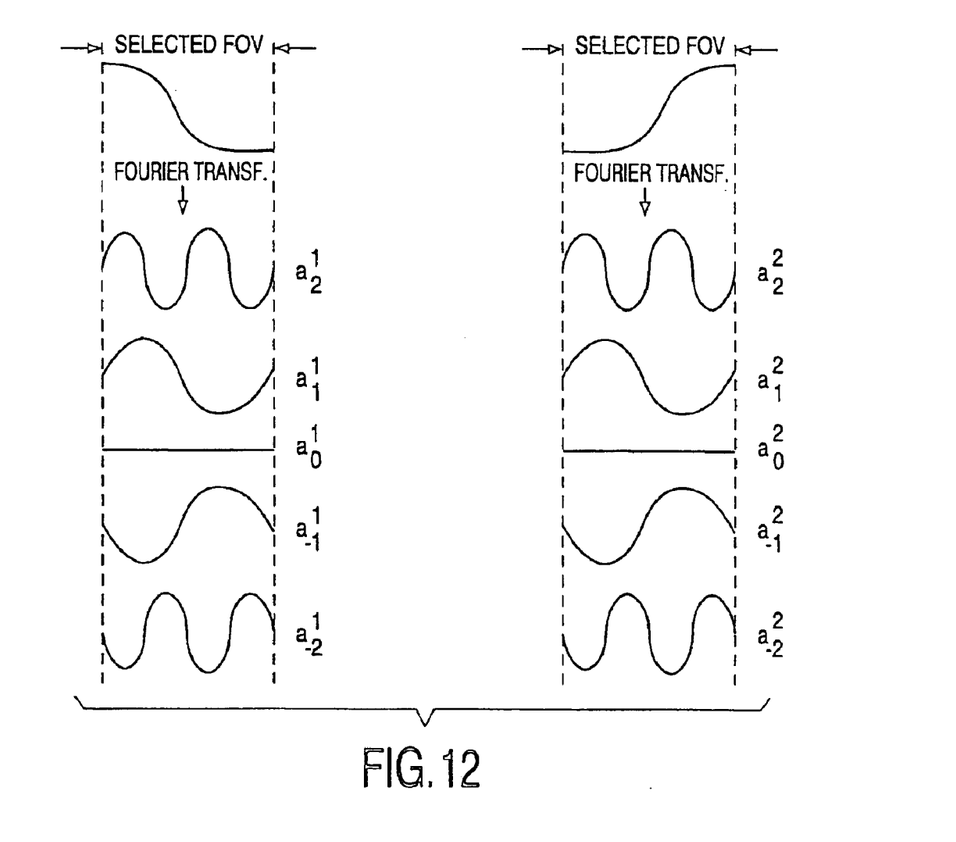
FIG. 12 is a graph illustrating the representation of the spatial sensitivity profiles shown in FIG. 11 in terms of spatial harmonics of a fundamental frequency.

The reference profile (amplitudes and phase response) of each coil 17, 18 is now expressed, by Fourier Transformation of those reference profiles, as a series of spatial harmonics of a fundamental frequency, one cycle of which is co-extensive with the field of view. In FIG. 12, it will be seen that reference profiles of coils 17, 18 are represented (as a close approximation) by a d.c. term and two harmonics, each defined by a reference coefficient. For coil 17, the d.c. reference coefficient is $a_0^1$ The coefficients of the first harmonic are $a_1^1$ and $a_{-1}^1$, respectively, for the two senses of rotation from one side of the field of view to the other. The coefficients of the second harmonic are $a_2^1$ and $a_{-2}^1$. These coefficients completely define the spatial profile of coil 17 once the field of view is selected. Different coefficients would define a different field of view. The same applies to the coil 18.

The reference data provides the prescription for the linear combinations (i.e. the weighting factors) used to synthesise the missing data and is, in the invention, the Fourier Domain. Module 24 receives these coefficients corresponding to the selected field of view. It also receives measured r.f. signals from coils 17, 18 corresponding to a series of phase-encode gradients. The received signals at different phase-encode gradients might each be generated in response to a separate r.f. excitation pulse, or a series of phase-encode lines may be collected following one r.f. excitation pulse.

Figure 13:
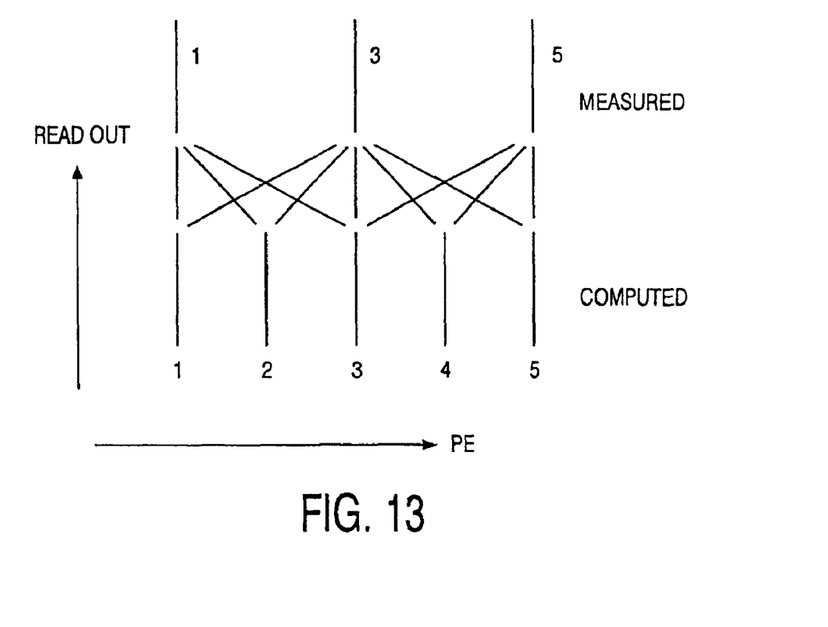
FIG. 13 is a representation of an example of the generation of k-space lines according to the invention.

Referring to FIG. 13, which represents spatial frequency lines in K-space, the measured signals could be phase-encode lines 1, 3, 5, denoted by $S_1^2$, $S_3^2$, $S_5^2$. The superscript denotes that these signals are measured by coil 18, superscript 1 denoting signals measured by coil 17. In the example shown in FIG. 13, while lines 1, 3 and 5 are measured, it is desired to compute lines 1 to 5.

Thus the object is to collect data using a reduced number of phase-encode gradients to reduce the time the patient spends in the apparatus by the use of parallel imaging. The lines represent the vertical rows of points in K-space shown in FIGS. 2 and 4. Coils 17 and 18 each collect K-space representations with missing lines. A knowledge of the spatial sensitivity profile of each coil enables the missing lines to be restored as in FIG. 2.

The spacing of the lines 1 to 5 to be computed is dictated solely by the fundamental spatial frequency in which the reference profiles are expressed, itself chosen by the selected field of view.

To return to FIG. 16, module 24 receives signals $S_1^1$, $S_3^1$, $S_5^1$, $S_1^2$, $S_3^2$, $S_5^2$, and the reference profiles expressed in terms of spatial harmonics dependent on the selected field of view.

Each measured signal from a given coil at a given phase-encode gradient is expressed as a weighted sum of the desired phase-encode lines with the weights determined from the proportions of the spatial harmonics required to represent the coil profile. For example, $S_3^2$ is expressed as follows:

$$S_3^2 = a_{-2}^2 s_1 + a_{-1}^2 s_2 + a_0^2 s_3 + a_1^2 s_4 + a_2^2 s_5$$

$S_3^2$ of course represents a column of points in k-space, while $s_1$ etc represents a column of points in k-space it is desired to compute. The coefficients $a_{-2}^2$ etc are known from fitting the measured reference profile to the chosen harmonics.

The calculations performed in module 24 entail assembling a set of linear simultaneous equations, one from each acquired phase-encode line and each coil. The total number of equations is the number of acquired phase-encode lines times the number of coils. The equations express the measured data (a set of measured phase-encode lines) in terms of a larger set of desired phase-encode lines.

In matrix form, we have:

$$\begin{pmatrix} S_1^1 \\ S_1^2 \\ S_3^1 \\ S_3^2 \\ S_5^1 \\ S_5^2 \\ \vdots \\ S_N^1 \\ S_N^2 \end{pmatrix} = \begin{pmatrix} a_{-2}^1 & a_{-1}^1 & a_0^1 & a_1^1 & a_2^1 & 0 & 0 & 0 & 0 \\ a_{-2}^2 & a_{-1}^2 & a_0^2 & a_1^2 & a_2^2 & 0 & 0 & 0 & 0 \\ 0 & 0 & a_{-2}^1 & a_{-1}^1 & a_0^1 & a_1^1 & a_2^1 & 0 & 0 \\ 0 & 0 & a_{-2}^2 & a_{-1}^2 & a_0^2 & a_1^2 & a_2^2 & 0 & 0 \end{pmatrix} \begin{pmatrix} s_1 \\ s_2 \\ s_3 \\ s_4 \\ s_5 \\ \vdots \\ s_N \end{pmatrix}$$

The coefficients a are known and S are measured, so $s_1$ etc are calculated by inverting the matrix. Final lines are produced by linear combinations of input lines with different weighting factors for each line and for each coil.

The k-space data with the missing lines restored is now passed to Fourier Transform module 25, and the resulting unaliased image is displayed on display 26.

Various points should be noted from the above. First, while three phase-encode gradients were applied, and five phase-encode lines were calculated, in reality a larger number of phase-encode lines would be calculated e.g. 256, and a correspondingly larger number of measurements would be made e.g. 128. There would be a corresponding number of points in the frequency encode direction. Second, the grid spacing of lines 1, 3 and 5 is unchanged in the calculated set of lines, but this is not necessary. The grid spacing of the calculated set of lines is determined by the field of view selected, and could be different from that of the measured lines, determined by the spacing of the phase-encode gradients measured.

Third, the spacing of the measured phase-encode gradients is equal, but the method applies just as well if unevenly spaced phase-encode lines are measured.

Figure 14:
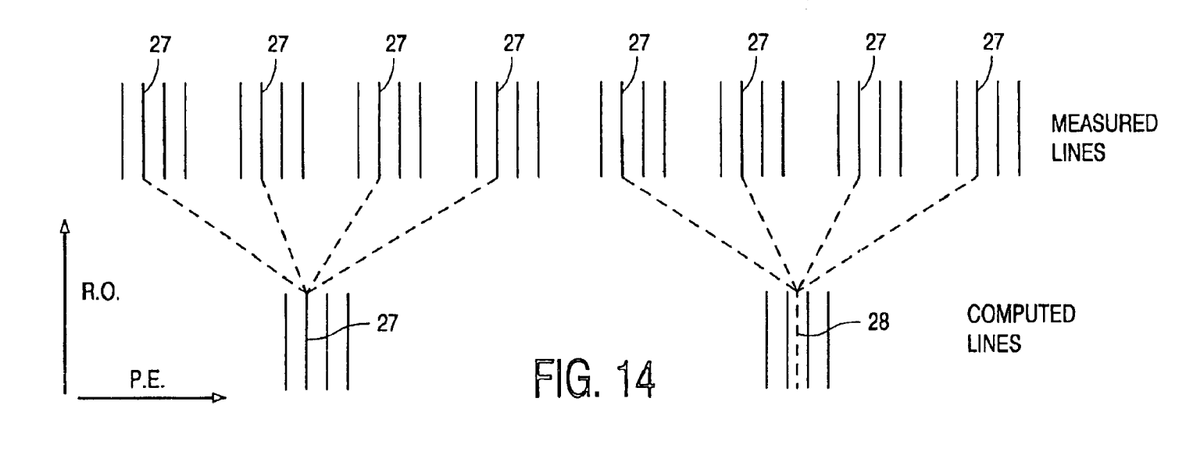
FIG. 14 is a representation of an example of the generation of k-space lines according to the SMASH method.

Fourth, consider interpolated line 2. All three measured lines 1, 3, 5 contribute the building up line 2. This contrasts with SMASH, as can be seen by reference to FIGS. 14 and 15. This shows symbolically measured K-space lines (FIG. 14) measured with four coils forming an array at four different phase-encode gradients. The four coil outputs at each phase-encode gradient are combined (left hand figure) to produce resultant lines at those respective phase-encode gradients. Interpolated lines are each produced (right hand figure) from the coil outputs at one phase-encode gradient, multiplied by a phase rotation reflecting the different modulation between that phase-encode gradient and the interpolated one. Each point on the interpolated line is calculated from the corresponding point on the resultant of the measured lines to its left or right, multiplied by an appropriate exponent. This is the known SMASH method.

The SMASH method relies on fitting pure spatial harmonics constructed using linear combinations of the sensitivity profiles of the component coils in the receiver array. Each omitted line of k-space is then generated from a single measured line by multiplying it by the fitted spatial harmonic e.g. if the signal $S_j$ for the line $j$ is measured, the signal $S_{j+m}$ is obtained from $S_{j+m}=C_m S_j$, where $C_m$ is the spatial harmonic that has a 2 $m\pi$ rotation in it. For example line 27 in FIG. 14 has been obtained by combining the corresponding lines on a point by point basis. Fitting the coil profiles to a suitable spatial harmonic provides a set of weighting factors for each coil output, which when the appropriate weighting factor is applied to each of copies of line 27 in FIG. 14 results in line 28 in FIG. 14 (right hand figure). In this example each line of acquired data is used to make two lines of final data (a copy of itself e.g. combining line 27 from each coil to make line 27 (left hand figure) and a shifted line (e.g. combining line 27 from each coil to make line 28 (right hand figure). As far as the Fourier Transform processor is concerned, a complete k-space plot without missing lines is received. The nature of the transformation of course constrains the coil geometry to particular shapes and arrangements of loops, as well as making the choice of evenly spaced phase-encode gradients a practical necessity.

Figure 15:
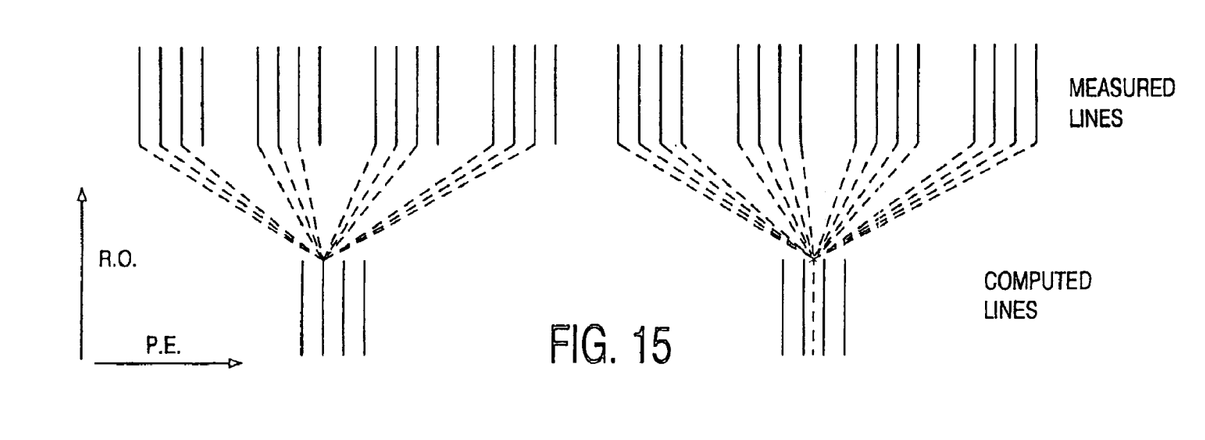
FIG. 15 is a representation of another example of the generation of k-space lines according the invention.

FIG. 15 shows the improvement of the invention. Not only each measured phase-encode line (left hand figure) but also each interpolated phase-encode line (right hand figure) is produced from multiple phase-encode lines (from three for the measured phase-encode lines and from four for the interpolated phase-encode lines). The result is that restrictions on coil geometry are relaxed compared to SMASH, and uneven phase-encode gradients are possible, unlike SMASH. In FIG. 15, the grid of computed phase-encode lines is half that for the measured phase-encode lines, half because of the interpolated lines, but the grid spacing of the computed lines can be any desired value, not related in any way, if desired, to that of the measured lines.

Fifth, reverting to FIG. 13, lines have been interpolated, and the method is particularly applicable to parallel imaging as described in the introduction. However, this is not an essential feature of the invention. The same number of lines could be computed as were measured. The invention could be used just to change the grid spacing, or to compute an evenly spaced set of phase-encode lines from a set collected at unevenly spaced phase-encode gradients, to permit simpler processing in FT module 25. There is no requirement for the number of computed lines to be related as a multiple of the number of measured lines. The number of computed lines could differ from the number of measured lines by an arbitrary number.

Sixth, each phase-encode gradient could be measured after one r.f. pulse. Equally, multi-echo techniques could be used where several phase-encode gradients are collected after each r.f. pulse.

Seventh, any number of array coils may be used. The only requirement is that they have a different spatial response. Thus, two coils at the same location with a different spatial pattern, such as loop and butterfly coils, are possible. Coils with the same spatial pattern but with different locations, such as spine array as in FIG. 6, or opposed coils on opposite sides of the body are possible. Any combination of these is possible.

Eighth, the spatial profile of the coil can be expressed by higher harmonics than the second harmonic used here. The highest harmonic can be as large as the maximum desired phase-encode line of the output data. Thus, if the process is used to generate 256 phase-encode lines, at least 128, or up to 256 harmonics can be employed.

Ninth, the invention is not restricted to slice imaging but also applies to volume imaging.

Tenth, the calculation in module 24 could go direct to image space without first calculating the phase-encode lines, i.e. the Fourier Transform performed in module 25 could be performed as a matrix multiplication in module 24, so that module 25 could be dispensed with.

It will be appreciated from the above that a generalised parallel imaging method that uses coil profiles to synthesise missing k-space lines has been developed. The proposed method is an extension of SMASH, which uses linear combinations of coil sensitivity profiles to synthesise spatial harmonics. In the approach described here, generalised SMASH represents sensitivity profiles directly in the Fourier domain to provide a general description of the spatial properties of the coils used. This removes restrictions imposed by conventional SMASH, so that the choice and position of the receiver coils can be made on the basis of sensitivity to the volume of interest, rather than having to consider their suitability for constructing spatial harmonics. Generalised SMASH also intrinsically allows additional freedom to accommodate acquisitions with either uniform or non-uniform k-space sampling and vary the reconstructed field of view. The proposed generalised method places SMASH on an equal footing with other parallel imaging techniques (SENSE and SPACE-RIP) while combining strengths from each. The method has been tested on phantom and human data and provides a robust method of data recovery.

The invention will now be explained in more detail.

The purpose of the invention is to improve parallel imaging from array receiver coils using k-space processing to synthesis a full k-space from partial acquisitions. The proposed method is more general and more robust than previous methods. Thus, known parallel imaging comes in two basic variations depending on whether the processing is performed directly on k-space data (SMASH) or on image domain data (SENSE). In both SMASH and SENSE a reduced phase-encode matrix is acquired, which for a reduction factor of n requires acquisition of only every nth line in k-space. The SMASH method relies on fitting pure spatial harmonics using linear combinations of the sensitivity profiles of component coils in the receiver array. Each omitted line of k-space is then generated from a single measured line by multiplying it by the fitted spatial harmonic, e.g. if the signal $S_j$ for line $j$ is measured, the signal $S_{j+m}$ is obtained from $S_{j+m} = C_m S_j$, where $C_m$ is the spatial harmonic that has a $2m\pi$ rotation in it. Demonstrations of the SMASH method have generally used linear arrays.

The prior method requires coil profiles to be combined to model a number of spatial harmonics. These have the properties that they have identical sensitivity across the field of view (FoV) of the image, and must differ from one another by $\exp{}^2 m\pi y/_{FoV}$, where y is a spatial co-ordinate in the phase encoding direction. Errors in achieving fits to these requirements cause errors in the reconstruction. This limits the minimum number of coils that can be used (e.g. for SENSE with twofold reduction, two coils are sufficient, but so far for SMASH published results have required a minimum of three coils). Also it places constraints on the choice of FoV. It is difficult to get the required (orthogonal) spatial harmonics for some combinations of coils and FoV. If only a few coils are used, achieving the required phase rotations across the FoV may require specific coil properties. The inventive step is to recognise that it is possible to make use of linear combinations of spatial harmonics to link several measured lines to generate an omitted line. This has the benefit of relaxing the fitting requirements imposed on the coil profiles and leads to improved results.

Consider the case of a speed up factor of two in detail to illustrate the invention. The acquired data would have every second line of k-space missing, i.e. acquire all $k_j$ for j=even ($k_{even}$) but omit all $k_j$ for j=odd ($k_{odd}$). With the existing method, the spatial harmonics used are $C_o = f(y)$ which maps each $k_{even}$ to itself and $C_1 = f(y).\exp i\Delta ky$, where $\Delta k = 2\pi/\text{FoV}$, which maps each $k_j$ to $k_{j+1}$. To make $C_o$ and $C_1$ we use linear combinations of the individual coil sensitivity profiles $c_i$. Thus $C_o = \Sigma n^o{}_1 c_1$ and $C_1 = \Sigma n^1{}_i c_i$.

In the new method, a more general fit of the form is allowed $$C_o = \{a_o + a_1{}_{exp} i\Delta ky + a_2 \exp{-i\Delta ky} + a_3 \exp 2i\Delta k_y + a_4{}_{exp\_} 2i\Delta ky + \ldots\}$$

and $$C_1 = \{b_o + b_1{}_{exp} i\Delta ky + b_2{}_{exp\_} i\Delta ky + b_3{}_{exp} 2i\Delta k_y + b_4{}_{exp\_} 2\Delta ky + \ldots\}$$

The more general $C_1$ and $C_2$ function must again be fitted by linear combinations of the coil profiles $c_i$, but this is easier to do. A generalisation of the constraint on amplitude and orthogonality phase is proposed as follows:

$$\int_o^{FoV} \left(\frac{|C_o|}{|C_1|}\right)^2 dy - \left(\int_0^{FoV} \frac{|C_o|}{|C_1|} dy\right) = min \quad (1)$$

and $$\left|\int_o^{FoV} C_o \cdot C_1 dy\right| = min \quad (2)$$

Ideally min→zero in both cases, but constraint 1 is optimised in preference to 2.

The solution can then be written in the form $$C_o S_j = a_o S_j + a_1 S_{j+1} + a_2 S_{j-1} + a_3 S_{j+2} + a_4 S_{j-2} + \ldots$$

$$C_1 S_j = b_o S_j + b_1 S_{j+1} + b_2 S_{j-1} + b_3 S_{j+2} + b_4 S_{j-2} + \ldots$$

which can be solved by simple matrix inversion to give values for all $S_{odd}$ in terms of the known $S_{even}$.

To achieve a full solution may require extra lines of data at the edges of k-space. These can be acquired directly or set to zero, introducing slight errors in a few values of $S_{odd}$ at the edge of k-space.

It is possible to fit the individual coil profiles with sums of spatial harmonics and then make the linear combinations.

The quantitation outlined according to the invention improves the accuracy of the fits that make up the spatial harmonics and this decreases artifacts in the images. It makes it easier to work with a wider variety of coil geometries and with fewer component coils. The orthogonality constraint is the key to this, by allowing flexibility in the numerical conditioning of the problem it trades artifacts for signal to noise ratio.

The theoretical basis of the invention will now be described in yet more detail.

Consider an array of n coils with spatial sensitivity profiles Cj(x,y) for j=0, 1, ..., n−1, used for slice selective imaging in the (x,y)-plane with two orthogonal in-plane directions of Fourier encoding ($k_x$, $k_y$). The MR signal from the jth coil can be written as $$S_j(k_x, k_y) = \iint dx dy C_j(x,y) \rho(x,y) \exp\{-ik_x x - ik_y y\} \quad [1]$$

where $\rho(x,y)$ is the target spin density. The x-direction represents the frequency encode (FE) direction and the y-direction the phase-encode (PE) direction.

Conventional SMASH requires the fitting of linear combinations of the $C_j(x,y)$ to form a number of spatial harmonics $\exp{-im\Delta ky}$, where $\Delta k = 2\pi/\text{FoV}$.

$$\sum_{j=0}^{n-1} w_j^m(x) C_j(x, y) = \exp{-im\Delta ky} \quad [2]$$

The spatial harmonics may be multiplied by an arbitrary spatially dependent tailoring function $f(x,y)$, which provides an additional degree of freedom in the fitting procedure.

$$\sum_{j=0}^{n-1} w_j^m(x) C_j(x, y) = f(x, y) \exp{-im\Delta ky} \quad [2a]$$

In the method of the invention, equation [2] is inverted to express the $C_j(x,y)$ as linear combinations of spatial harmonics, $$C_j(x, y) = \sum_{m=-p}^{+p} a_j^m(x) \exp{-im\Delta ky} \quad [3]$$

Equation [3] is a natural way to express the informational content of the coil sensitivity profiles and is arbitrarily accurate regardless of the number of coils. Weighting functions $w_j^m$ and coefficients $a_j^m$ are written as functions of x to allow for variation of the coil sensitivity profiles across the field of view. Therefore equations [2] and [3] are required to hold for the data in the phase-encode direction at individual spatial locations in the frequency encode (or read-out) direction, which is a trivial requirement for equation [3].

Fourier transforming equation [1] in the FE ($k_y$) direction and substituting for $C_j(x,y)$, $$S_j(x, k_y) = \int dy C_j(x, y)\rho(x, y)\exp\{-ik_y y\} \quad [4]$$

$$= \sum_{m=-p}^{+p} a_j^m(x) \int dy \rho(x, y)\exp\{-i(k_y + m\Delta k)y\}$$

$$= \sum_{m=-p}^{+p} a_j^m(x) S(x, k_y + m\Delta k)$$

which expresses the coil modulated signals $S_j$ (the acquired data) in terms of the pure signal S from the spin density (the required data).

For each point $(x, k_y)$ of the acquired data, the signal from n coils is given by $$\begin{pmatrix} S_0(x, k_y) \\ \cdots \\ S_{n-1}(x, k_y) \end{pmatrix} = \begin{pmatrix} a_0^{-p}(x) & \cdots & a_0^0(x) & \cdots & a_0^p(x) \\ \cdots & \cdots & \cdots & \cdots & \cdots \\ a_{n-1}^{-p}(x) & \cdots & a_{n-1}^0(x) & \cdots & a_{n-1}^p(x) \end{pmatrix} \begin{pmatrix} S(x, k_y - p\Delta k) \\ \cdots \\ S(x, k_y) \\ \cdots \\ S(x, k_y + p\Delta k) \end{pmatrix} \quad [5]$$

In conventional SMASH equation [5] is required to be a solvable set of equations by insisting that the centre matrix is over-determined, or at least square. Then matrix inversion gives a solution for the $S(x,k_y)$ in terms of the $S_j(x,k_y)$ on a pixel by pixel basis. Since generalised SMASH allows any number of harmonic terms to be used in equation [3], equation [5] is in general a highly under-determined set of equations. However, the overlap of $S(x,k_y+p\Delta k)$ between successive points in the $k_y$ direction makes it possible to recover a filly determined set of equations and then solve for $S(x,k_y)$ on a line by line basis.

Consider a single column of the data acquired in the phase-encode direction (y) at a single location in the frequency encode direction (x). (Note that the X and Y-directions are reversed compared to FIG. 1). For simplicity it is initially assumed that N/M points uniformly spaced M apart have been acquired (hence $\Delta k=1$). This data therefore consists of the concatenation of the left-hand sides of equation [5] for successive values of $k_y$, namely $k_y=0$, M, 2M, 3M, ..., N−M.

Let the left-hand sides of equation [5] be $S_{k_y}(x)$ and the central matrices $A_{k_y}(x)$, then $$\begin{pmatrix} S_0(x) \\ \cdots \\ S_{N\,M}(x) \end{pmatrix} = \begin{pmatrix} A_0(x) & \cdots & 0 \\ & \cdots & \\ 0 & \cdots & A_{N\,M}(x) \end{pmatrix} \begin{pmatrix} S(x, p) \\ \cdots \\ S(x, N-1+p) \end{pmatrix} \quad [6]$$

As written this equation is solving nN/M equations for N+2p unknowns, which is 2p more than necessary. In particular, only $S(x,0)$ to $S(x,N-1)$ in the right hand side matrix is required.

The extra 2p lines are at the extreme ends of k-space and as such would be expected to contain very little information. However, simply truncating the $S(x,k_y)$ column matrix to neglect these terms can result in artifacts, because the concomitant truncation of the $A_{k_y}(x)$ matrices damages the fidelity of the representations of the coil profiles. This problem is avoided by invoking the periodic nature of the data. This leaves the central matrix in [6] as nN/M×N in size as required, but the elements in the individual $A_{k_y}(x)$ matrices that would lie out side this matrix are wrapped around to the other end of their respective rows.

Hence $$\begin{pmatrix} S_0(x) \\ \cdots \\ S_{N-M}(x) \end{pmatrix} = \begin{pmatrix} A_0(x) & & A_0'(x) \\ & \cdots & \\ A_{N-M}'(x) & & A_{N-M}(x) \end{pmatrix} \begin{pmatrix} S(x, 0) \\ \cdots \\ S(x, N-1) \end{pmatrix} \quad [7]$$

or $S_J(x) = A(x)\ S(x)$

In the above equation the sub-matrices $A'_{k_y}(x)$ represent the parts of $A_{k_y}(x)$ that have been wrapped to the other end of a row and $A(x)$ denotes the final modified matrix, see FIG. X.

Equation [7] is large a set of linear equations subject to noise. Their solution involves a matrix inversion $$A^{-1}S_j(x) = I\ S(x) \quad [8]$$

where I is the identity matrix. Depending on the circumstances (coil geometry, speed up factor, field of view required etc), the fidelity of the resulting values in $S(x)$ can suffer due to poor numerical condition of the inversion. Conditioning can be improved by acquiring more data. This may be accomplished using more coils to image the object or by measuring more k-space lines. The latter choice requires a strategic decision as to which extra lines to use and this is discussed below.

In the preceding discussion it has been assumed that the acquired data has been uniformly spaced M lines apart. This is not a requirement, although it is desirable in practice to have data that cover the full target range of k-space to avoid having to generate lines without local support. Equation [7] relates k-space lines acquired at one set of spacings (i.e. M apart) to those at different spacing, commensurate or non-commensurate with the initial acquisition. Equation [2] may be used to fit the coil profiles to $\exp{-i(\delta + m\Delta k)y}$ for any arbitrary offset $\delta$. The invention (generalised SMASH) allows the use of truly arbitrary spacings. Although it is unclear whether there is any benefit to using non-uniformly spaced shifts, this increased flexibility is a unique feature of generalised SMASH. Uniform spacings of the form $\exp{-i(\delta + m\Delta k\lambda)y}$, where $\lambda$ is the new unit spacing, result in post-acquisition changes in the FoV.

By comparison with conventional SMASH, equation [2], one may also construct R synthesised coil profiles $E_r(x,y)$ from the n individual coil profiles $C_j(x,y)$, $$E_r(x, y) = \sum_{j=0}^{n-1} w_j^r(x) C_j(x, y) = \sum_{m=-p}^{+p} b_m^r(x) \exp{-im\Delta k y} \quad [9]$$

where $$b_m^r(x) = \sum_{j=0}^{n-1} w_j^r(x) a_m^j(x)$$

and r ranges from 0 to R−1, with $M \leq R \leq n$. In this case, the $w_j^r$ are weighting terms that can be chosen to impart into the synthesised coil profiles $E_r(x,y)$ features that may be beneficial to image quality or computational efficiency. For example, a circular boundary condition over the FoV, or the reduction of the number of harmonics in the synthesised coil profiles, in comparison to the original coil profiles.

Provided the coil profiles allow, equation [8] reduces to conventional SMASH by choosing the $w_j^r$ such that all the $b_m^r$ are zero except when m=r, for which $b_r^r=1$. In terms of equation [8] this imposes a requirement that $A^{-1}$ be a block-diagonal matrix. Thus conventional SMASH constructs a specific solution directly to give S, but imposes a restriction on the form that $A^{-1}$. Since the inverse of a block diagonal matrix is also block diagonal, this is equivalent to requiring the coil sensitivities to be expressible in at most n spatial harmonics, e.g. requiring that m runs from 0 to n−1 in equation [3].

Generalised SMASH requires no special properties of the solution $A^{-1}$. In practical terms this means the implicit restrictions of SMASH (i.e. that synthesised coil profiles be found that are fully orthogonal and have the same magnitude) are removed. Actual coil profiles can be used rather than specially constructed ones, making any spatially distributed arrangement of coils suitable for generalised SMASH imaging.

An interesting feature of the block-diagonality, referred to above, enables the inversion of A to be performed on a block by block basis (corresponding to a pixel by pixel reconstruction) which considerably decreases the computations required. Since this is also the method that operates with SENSE, one may presume that the two approaches are similarly computationally efficient.

As formulated in this paper, generalised SMASH requires reference data to determine the coil sensitivity profiles $C_j(x,y)$. The reference data needs sufficient resolution to accurately represent the properties of $C_j(xy)$ (13), and this may be a much lower resolution than that used for the target data. Reference data may be acquired separately, but there are advantages to using data that has been obtained in situ using a scan obtained during the examination. Contaminating spatial structure can be divided out using ratios of the reference data from the individual coils, or more generally by dividing the coil profiles by a linear measure of the spatial structure [4, 13]. To achieve this we may make use of the function $f(x,y)$ of equation [2a], and construct a linear measure of the spatial structure, $f(x,y)=P(x,y)\rho(x,y)$. Then with in situ reference data $C'_j(x,y)=C_j(x,y)\rho(x,y)$ we can write in place of equation [1]

$$S_j(k_x, k_y) = \int\int dx dy \frac{C'_j(x, y)}{f(x, y)} P(x, y)\rho(x, y)\exp\{-ik_x x - ik_y y\}$$

and obtain a solution for $\rho(x,y)$ modulated by $P(x,y)$, which depends on the chosen $f(x,y)$.

One property of in situ data is that it does not usually cover the full FoV and therefore may have regions of zero signal. This results in "noise over noise" regions when dividing out the spatial information, which can corrupt the sensitivity information with artificially high pixel values. For SENSE (image domain) processing, pixel exclusion by thresholding can be applied since the required coil profiles $C_j(x,y)$ are preserved where they are needed. The same situation pertains to SMASH, although imposing a sharp cut off introduces high frequency terms in the Fourier expansion of $C'_j(x,y)$. This introduces more significant terms in equation [3], which in turn reduces computational efficiency. To remedy this, one may interpolate or extrapolate over the regions of zero signal, which can be done in a flexible way because the generated regions correspond to locations that will not have signal in the final reconstruction.

A further source of high order Fourier terms arises when the reference data does not conform to circular boundary conditions. The discontinuity over the edge of the FoV requires high order Fourier terms to model. There are two ways to remedy this. The first is to use equation [8] to construct synthesised coil profiles that have the required circular boundary condition. The second is to artificially attenuate $C'_j(x,y)$ to a fixed value such as zero at both edges of the FoV using the tailoring function $f(x,y)$. Since there is some degradation of the sensitivity information in this latter procedure, it is preferable to use a function that shrinks quite rapidly and only over a small region, for example $\sin^{1/2}(\pi y/FOV)$. This exchanges the discontinuity for a smoothly varying function.

EXAMPLE

Data were acquired from phantoms and volunteers on a 0.5T Apollo (Marconi medical systems, Ohio), modified for use with up to eight receiver coils. Two coils with different coil geometry were used: a commercially available 4 coil spine array consisting of linearly arranged 100 mm square coils and a locally developed four coil receive only head coil consisting of 300 mm square coils wrapped around a cylindrical former. In both cases the individual coils geometrically isolated from nearest neighbours by overlapping and any coupling minimised further by low impedance pre amplifier circuitry. The spine coil was were actively decoupled during transmit, whereas the head coil was passively decoupled.

Phantom data were acquired using both the spine coil (using 2,3,and 4 elements) and the 4 channel enveloping head coil. Both self reference data (reference data from object in situ) and separate reference data (from a large uniform phantom) were used to process undersampled target images. In vivo data were acquired in the brain of a volunteer using the 4 channel enveloping phased array coil. Full FoV reference data was obtained with the subject in situ, and both full and reduced FoV target data was obtained in each case. All data were acquired using two or four echo multislice fast spin echo sequences modified to produce complex image output.

All programming was done in IDL (version 5.3) on a DEC alpha workstation running UNIX. To solve equation [7] we used IDL's singular value decomposition of the matrix A, which is an $O(N^3)$ type algorithm, although other matrix inversion methods may be more efficient. For instance, it has been reported that the SV decomposition of an N×M matrix can be performed with time complexity $O(N^2 z)$, where z is the number of non-zero elements in a row (column), compared with the usual $O(N^3)$. To accommodate the complex nature of the data we used a procedure of operating on pseudo real matrices by row and column enlargement which introduced an additional $2^3$ computational penalty. Thus a typical reconstruction of a 256×256 two-fold degenerate complex image from 2 coils could take from 10 minutes to several hours depending on the procedures involved, but it is estimated that a complex, sparse, C (or FORTRAN) implementation of generalised SMASH would be one to two orders of magnitude faster.

Reconstructions were performed using half the number of k-space lines from a fully acquired 2 coil data-set in a variety of combinations. One particularly notable feature, mentioned above, is the sharp fall-off in quality of reconstructed data with "distance" from the acquired data, which indicates that lines more than one or two away from any measured line are not recoverable by SMASH. This is to be expected since in principle they would require higher speed-ups than are possible with two coils.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. Apparatus for magnetic resonance imaging, comprising:
   means for exciting magnetic resonant (MR) active nuclei in a region of interest;
   an array of at least two r.f. receive coils for receiving data from the region of interest;
   means for creating magnetic field gradients in a phase-encode direction for spatially encoding the excited MR active nuclei; and
   processing means for using the lines of data received by each r.f. receive coil at each phase-encode gradient together with reference spatial sensitivity profiles of each coil in a phase-encode direction represented in terms of spatial harmonics of a fundamental frequency one cycle of which corresponds with a desired field of view, to generate a set of phase-encode lines, each generated phase-encode line corresponding to greater than one measured phase encode gradient data line.

2. Apparatus as claimed in claim 1, in which the processor is arranged to compute the phase-encode lines by solving a set of simultaneous equations each derived from a measured line of data at one phase-encode gradient from one coil.

3. Apparatus as claimed in claim 2, in which the processor uses coefficients required to represent the reference spatial profile of each coil in terms of the harmonics selected.

4. Apparatus as claimed in claim 3, in which the processor uses an inverse of a matrix containing those coefficients.

5. Apparatus as claimed in claim 1, in which the processor uses first and second harmonics.

6. Apparatus as claimed in claim 5, in which the number of harmonics used is at least half the number of phase-encode lines.

7. Apparatus as claimed in claim 1, in which the processor is arranged to interpolate computed phase-encode lines between measured phase-encode lines in parallel processing.

8. Apparatus as claimed in claim 1, the processor is arranged to change the grid spacing of the measured lines.

9. Apparatus as claimed in claim 1, in which the processor is arranged to change an unevenly spaced set of measured lines into an evenly spaced set of computed lines.

10. A method of magnetic resonance imaging, comprising:
    exciting magnetic resonant (MR) active nuclei in a region of interest;
    receiving data from the region of interest using an array of at least two r.f. receive coils;
    creating magnetic field gradients in a phase-encode direction for spatially encoding the excited MR active nuclei; and
    processing the lines of data received by each r.f. receive coil at each phase-encode gradient together with reference spatial sensitivity profiles of each coil in a phase-encode direction represented in terms of spatial harmonics of a fundamental frequency one cycle of which corresponds with a desired field of view, to generate a set of phase-encode lines, each generated phase-encode line corresponding to greater than one measured phase encode gradient data line.

11. A method as claimed in claim 10, in which the processor computes the phase-encode lines by solving a set of simultaneous equations each derived from a measured line of data at one phase-encode gradient from one coil.

12. A method as claimed in claim 11, in which the processor uses coefficients required to represent the reference spatial profile of each coil in terms of the harmonics selected.

13. A method as claimed in claim 12, in which the processor uses an inverse of a matrix containing those coefficients.

14. A method as claimed in claim 10, in which the processor uses first and second harmonics.

15. A method as claimed in claim 14, in which number of harmonics used is at least half the number of phase-encode lines.

16. A method as claimed in claim 10, in which the processor interpolates computed phase-encode lines between measured phase-encode lines in parallel processing.

17. A method as claimed in claim 10, the processor changes the grid spacing of the measured lines.

18. A method as claimed in claim 10, in which the processor changes an unevenly spaced set of measured lines into an evenly spaced set of computed lines.

* * * * *